(12) United States Patent
Sim et al.

(10) Patent No.: US 12,278,483 B2
(45) Date of Patent: Apr. 15, 2025

(54) SOLID INSULATED SWITCH

(71) Applicant: LS ELECTRIC CO., LTD., Anyang-si (KR)

(72) Inventors: Jungwook Sim, Anyang-si (KR); Jaeho Lee, Anyang-si (KR); Woonghyeob Song, Anyang-si (KR); Sunghee Kang, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 165 days.

(21) Appl. No.: 17/928,537

(22) PCT Filed: Mar. 30, 2021

(86) PCT No.: PCT/KR2021/003887
§ 371 (c)(1),
(2) Date: Nov. 29, 2022

(87) PCT Pub. No.: WO2021/241871
PCT Pub. Date: Dec. 2, 2021

(65) Prior Publication Data
US 2023/0216291 A1   Jul. 6, 2023

(30) Foreign Application Priority Data
May 29, 2020 (KR) .................. 10-2020-0065318

(51) Int. Cl.
*H02H 7/20* (2006.01)
*H02H 3/027* (2006.01)
(Continued)

(52) U.S. Cl.
CPC ............. *H02H 7/20* (2013.01); *H02H 3/027* (2013.01); *H02H 3/05* (2013.01); *H02M 1/34* (2013.01); *H03K 17/567* (2013.01)

(58) Field of Classification Search
CPC ............. H03K 17/567; H03K 17/6871; H03K 17/6874; H03K 2217/0054; H02H 3/05; (Continued)

(56) References Cited

U.S. PATENT DOCUMENTS 6,801,443 B2  10/2004  Manthe
6,952,354 B1  10/2005  Yang et al.
(Continued)

FOREIGN PATENT DOCUMENTS

EP  3591825 A1  1/2020
JP  61095611 A * 5/1986  ........... H03K 17/125
(Continued)

OTHER PUBLICATIONS

Machine translation of Kinoshita Japanese Patent Document JP 61-95611 A May 1986 (Year: 1986).*

(Continued)

*Primary Examiner* — Kevin J Comber
(74) *Attorney, Agent, or Firm* — K&L Gates LLP (57) ABSTRACT

The present disclosure relates to a solid insulated switch using a semiconductor; comprising a main circuit unit connected between systems on both sides thereof, and which has a first semiconductor and a second semiconductor arranged in a series; a snubber circuit having a capacitor and a resistor arranged in a series, one end connected in parallel to the front end of the first semiconductor switch, and the other end connected in parallel to the rear end of the second semiconductor switch; a freewheeling circuit, having a diode and a resistor arranged in a series, one end connected to a common contact between the first semiconductor switch and the second semiconductor switch, and the other end connected to the ground; and a mechanical switch for ensuring physical insulation after fault current interruption.

10 Claims, 7 Drawing Sheets

(51) Int. Cl.
*H02H 3/05* (2006.01)
*H02M 1/34* (2007.01)
*H03K 17/567* (2006.01)

(58) Field of Classification Search
CPC ............ H02H 3/027; H02H 3/08; H02H 7/20; H02M 1/34; H01H 9/54; H01H 33/596
USPC .......................................................... 361/42
See application file for complete search history.

(56) References Cited

U.S. PATENT DOCUMENTS

| | | | |
|---|---|---|---|
| 9,276,401 B2 | 3/2016 | Rozman et al. | |
| 2015/0002977 A1* | 1/2015 | Dupraz | H01H 9/542 361/115 |
| 2015/0055263 A1* | 2/2015 | Tekletsadik | H02H 9/021 361/93.6 |

FOREIGN PATENT DOCUMENTS

| | | | |
|---|---|---|---|
| JP | S6195611 A | 5/1986 | |
| JP | H10126961 A | 5/1998 | |
| JP | 2000134908 A | 5/2000 | |
| JP | 2001145331 A | 5/2001 | |
| KR | 20170108140 A | 9/2017 | |
| KR | 101994301 B1 | 6/2019 | |
| KR | 20200024069 A | 3/2020 | |
| KR | 102222127 B1 | 3/2021 | |
| KR | 102465165 B1 | 11/2022 | |
| WO | 2014139559 A1 | 9/2014 | |
| WO | WO-2020045889 A1 * | 3/2020 | ............ H02H 3/087 |
| WO | WO-2020166267 A1 * | 8/2020 | |

OTHER PUBLICATIONS

Machine translation of Hoon et al. International Patent Document WO 2020045889 A1 Mar. 2020 (Year: 2020).*
Machine translation of Junpei et al. International Patent Document WO 2020/166267 Jan. 2020 (Year: 2020).*
Machine translation of Hoon et al. International Patent Document WO 2020/0045889 Mar. 2020 (Year: 2020).*
Office Action for related Japanese Application No. 2022-562323; action dated Nov. 14, 2023; (3 pages).
International Search Report for related International Application No. PCT/KR2021/003887; report dated Dec. 2, 2021; (6 pages).
Written Opinion for related International Application No. PCT/KR2021/003887; report dated Dec. 2, 2021; (10 pages).
Extended European Search Report for related European Application No. 21812331.3; action dated Jun. 18, 2024; (8 pages).

* cited by examiner

SOLID INSULATED SWITCH

CROSS-REFERENCE TO RELATED APPLICATIONS

This application is the National Stage filing under 35 U.S.C. 371 of International Application No. PCT/KR2021/003887, filed on Mar. 30, 2021, which claims the benefit of earlier filing date and right of priority to Korea utility model Application No. 10-2020-0065318 filed on May 29, 2020, the contents of which are all hereby incorporated by reference herein in their entirety.

FIELD

The present disclosure relates to a solid insulated switch, and more particularly, to a solid insulated switch using a semiconductor.

BACKGROUND

With the introduction of a new concept power system using a power semiconductor from a power system in which a copper-based power device such as a generator, a transformer, and a circuit breaker has been used in the related art, there is a need for a different type of protection device.

In a mechanical circuit breaker in the related art, when a failure occurs in a system, it takes several tens of msec or more until the determination of the failure, the operation of a circuit breaker contact latch, the opening of a circuit breaker contact, and complete breaking after arc extinction between contacts, and during that time, a fault current energizes the system. Therefore, power devices in a system in the related art have been required to be designed to withstand a thermal and mechanical shock caused by such a fault current. However, in the case of a system to which a power converter configured with a power semiconductor is applied, current carrying capacity is very low compared to a copper-based power device, and thus in the event of a fault, high-speed breaking of the fault current is further required.

Furthermore, since there is no current zero point in the case of a direct current, unlike an alternating current, it is not easy to extinguish an arc current generated after opening a contact in a method of opening to break the contact in the related art.

Therefore, a solid insulated switch using a semiconductor is proposed as a good method to solve such a problem because a high-speed current breaking operation is possible.

In general, a solid insulated switch using a semiconductor device is configured with a power semiconductor device and an arrester for erasing energy stored by an inductance of the system at the moment of breaking.

Figure 1:
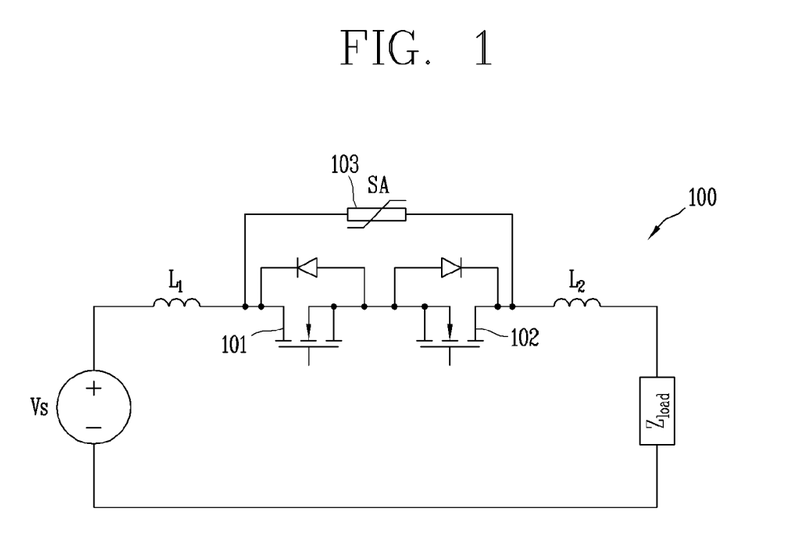
FIG. 1 is a circuit diagram illustrating a solid insulated switch 100 in the related art.

FIG. 1 is a circuit diagram illustrating a solid insulated switch 100 in the related art. Describing an operation process of the solid insulated switch 100 with reference to FIG. 1, when a failure is detected at any point in a power supply side or load side line, semiconductor switch devices 101, 102 are turned off through a gate circuit. At this time, a voltage at both ends of the solid insulated switch 100 rises by energy stored in both system inductances L1, L2, and when the voltage is above an operation voltage of an arrestor 103, the arrestor 103 is conducted to suppress voltage rise, and energy is dissipated from the arrester 103.

However, in this case, there is a limit to erasing energy generated from an entire system with only the arrester 103, and arresters must be configured in parallel to increase energy capacity in order to erase sufficient energy. Here, since there is a deviation for each arrester, damage may occur due to the resultant non-uniformity, and there is also difficulty in selecting the arrester at an appropriate voltage.

SUMMARY

The present disclosure is contrived to solve the foregoing and other problems, and an aspect of the present disclosure is to provide a bidirectional solid insulated switch using a semiconductor device to break a bidirectional fault current in a DC circuit at high speed.

Furthermore, another aspect of the present disclosure is to provide a solid insulated switch including a snubber circuit and a freewheeling circuit in order to protect a semiconductor device from energy generated by a system inductance component when breaking a fault current.

In addition, still another aspect of the present disclosure is to provide a solid insulated switch including an air gap switch (mechanical switch) for a physical insulation after breaking the fault current.

In order to achieve the foregoing and other objectives, according to an aspect of the present disclosure, a solid insulated switch according to an embodiment of the present disclosure may include a main circuit unit in which a first semiconductor switch and a second semiconductor switch are arranged in series, a snubber circuit, one end of which is connected to a front end of the first semiconductor switch, and the other end of which is connected in parallel to a rear end of the second semiconductor switch, and a freewheeling circuit, one end of which is connected to a common contact between the first semiconductor switch and the second semiconductor switch, and the other end of which is connected to a ground.

According to an embodiment, the solid insulated switch may be connected between a system A and a system B, the solid insulated switch further including a first mechanical switch connected in parallel to power source side front and rear ends to ensure a physical insulation from the power source after breaking is completed, wherein after a breaking operation of the first and second semiconductor switches, the first mechanical switch is open through a separate signal or time delay to maintain a physical insulation of the solid insulated switch.

According to an embodiment, a first MOSFET device and a first backward diode may be connected in parallel for the first semiconductor switch, and a second MOSFET device and a second backward diode may be connected in parallel for the second semiconductor switch, wherein the first MOSFET device and the second MOSFET device are N-channel MOSFET devices, the first semiconductor switch and the second semiconductor switch are configured to be connected in series in opposite directions facing each other to break fault currents flowing in both directions, a cathode and an anode of the first backward diode are respectively connected to a drain and a source of the first MOSFET device, and a cathode and an anode of the second backward diode are respectively connected to a drain and a source of the second MOSFET device.

According to an embodiment, a capacitor of the snubber circuit may be connected to a front end of the first semiconductor switch, and one end of a resistor of the snubber circuit may be connected in series with the capacitor, and the other end thereof may be configured to be connected to a rear end of the second semiconductor switch.

According to an embodiment, the freewheeling circuit may include a resistor configured to be connected to the ground, and a forward diode, an anode of which is connected to the resistor, and a cathode of which is connected a common contact between the first semiconductor switch and the second semiconductor switch.

According to an embodiment, in the event of an accident in the system A, energy generated by an inductance component of the system A may be erased by the freewheeling circuit and the first diode of the first semiconductor switch, and energy generated by an inductance component of the system B may be erased by the snubber circuit.

According to an embodiment, in the event of an accident in the system B, energy generated by an inductance component of the system B may be erased by the freewheeling circuit and the second diode of the second semiconductor switch, and energy generated by an inductance component of the system A may be erased by the snubber circuit.

According to an embodiment, the solid insulated switch may further include a second mechanical switch connected in parallel to front and rear ends of the system B to ensure a physical insulation from the system A and the system B after breaking is completed, wherein after the breaking operation of the first and second semiconductor switches, the second mechanical switch is further open through a separate signal or time delay to maintain a physical insulation of the solid insulated switch.

According to an embodiment, the solid insulated switch may further include an arrester connected in parallel to the solid insulated switch, wherein in the event of an accident in the system A, energy generated by an inductance component of the system B is erased by the snubber circuit and the arrester, and in the event of an accident in the system B, energy generated by an inductance component of the system A is erased by the snubber circuit and the arrester.

According to an embodiment, the snubber circuit may further include a second capacitor and a second resistor connected in parallel to the capacitor and the resistor of the snubber circuit, wherein one end of the second capacitor is connected to a front end of the first semiconductor switch, and one end of the second resistor is connected to a rear end of the second semiconductor switch.

According to at least one of the embodiments of the present disclosure, the present disclosure may provide a bidirectional solid insulated switch using a semiconductor device to break a bidirectional fault current in a DC circuit at high speed.

According to at least one of the embodiments of the present disclosure, the present disclosure may provide a solid insulated switch including a snubber circuit and a freewheeling circuit in order to protect a semiconductor device from energy generated by a system inductance component when breaking an accident current.

According to at least one of the embodiments of the present disclosure, the present disclosure may provide a solid insulated switch including an air gap switch (mechanical switch) for a physical insulation after breaking the fault current.

BRIEF DESCRIPTION OF THE DRAWINGS

FIGS. 4A to 5C are exemplary views for explaining a specific operation of the circuit of the solid insulated switch 200 when a short-circuit accident occurs in both systems, respectively.

DETAILED DESCRIPTION

The foregoing objective of the present disclosure, as well as the configuration and working effect thereof to accomplish the foregoing objective will be more clearly understood by the following description for preferred embodiments of present disclosure with reference to the accompanying drawings.

The embodiments disclosed herein will be described in detail with reference to the accompanying drawings, and the same or similar elements are designated with the same numeral references regardless of the numerals in the drawings and their redundant description will be omitted. In describing the embodiments disclosed herein, moreover, the detailed description will be omitted when a specific description for publicly known technologies to which the invention pertains is judged to obscure the gist of the present disclosure. Also, it should be understood that the accompanying drawings are merely illustrated to easily explain the concept of the invention, and therefore, they should not be construed to limit the technological concept disclosed herein by the accompanying drawings, and the concept of the present disclosure should be construed as being extended to all modifications, equivalents, and substitutes included in the concept and technological scope of the invention.

The terms including an ordinal number such as first, second, and the like may be used to describe various elements, but the elements should not be limited by those terms. The terms are used merely for the purpose to distinguish an element from the other element.

Furthermore, in this specification, the designation of a "front end" and a "rear end" for any element is based on a flow direction of a current in a steady state. For example, when a switch is provided between positive and negative poles of a power source, a current flows in the order of "a positive pole of the power source—a front end of the switch—the switch—a rear end of the switch—a negative pole of the power source" in a steady state.

FIG. 1 is a circuit diagram illustrating a solid insulated switch 100 in the related art.

In general, the solid insulated switch 100 using a semiconductor device in a bidirectional DC system includes power semiconductor modules 101, 102 for breaking a fault current, and an arrester SA 103 for erasing energy generated by system inductance components L1, L2 at the moment of breaking the fault current.

Here, the power semiconductor modules 101, 102 are disposed in opposite directions facing each other in order to breaking a bidirectional fault current. In addition, the arrester SA 103 is configured to be connected in parallel to the power semiconductor modules 101, 102 to prevent energy generated by the system inductance components L1, L2 from flowing into the semiconductor modules to damage the semiconductor devices.

Describing an operation process of the solid insulated switch 100 with reference to FIG. 1, when a failure is detected at any point in a power supply side or load side line, semiconductor switch devices 101, 102 are turned off through a gate circuit. At this time, a voltage at both ends of the power semiconductor switches 101, 102 is increased by energy stored in both system inductance components L1, L2.

At this time, when the voltage is above an operation voltage of the arrester 103, the arrestor 103 is conducted to suppress voltage rise, and energy is dissipated from the arrester 103.

However, there is a limit to erasing the energy generated from an entire system with the foregoing arrester 103, and arresters must be configured in parallel to increase energy capacity in order to erase sufficient energy. Here, since there is a deviation for each arrester, damage may occur due to the resultant non-uniformity, and there is also difficulty in selecting the arrester at an appropriate voltage.

Therefore, the present disclosure proposes a circuit of a solid insulated switch capable of breaking a fault current generated from a bidirectional DC system at high speed to protect a power device in the system, and effectively erasing energy due to both system inductance components when breaking the fault current to quickly and safely break the fault current.

Figure 2:
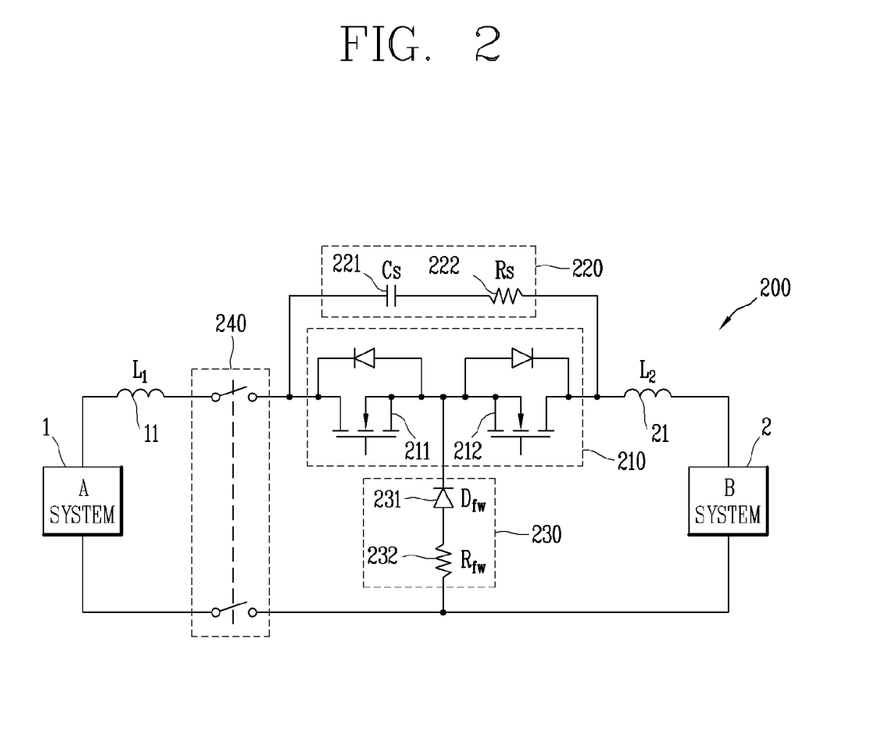
FIG. 2 is a circuit diagram illustrating a circuit of a solid insulated switch 200 according to an embodiment of the present disclosure.

FIG. 2 is a circuit diagram illustrating a circuit of the solid insulated switch 200 according to an embodiment of the present disclosure.

Referring to FIG. 2, the solid insulated switch 200 may include a main circuit unit 210 in which a first semiconductor switch 211 and a second semiconductor switch 212 are arranged in series between a system A 1 and a system B 2.

In this case, a first inductor L1 11 representing a system A 1 inductance component and a second inductor L2 21 representing a system B 2 inductance component may be taken into consideration.

In a circuit of the solid insulated switch 200 of FIG. 2 according to an embodiment of the present disclosure, assuming that the system A 1 is located at a power source side and the system B 2 is located at a load side, a current in a steady state flows out from a positive pole of a power source into a negative pole of the power source through a load.

Meanwhile, according to an embodiment of the present disclosure, the first semiconductor switch 211 and the second semiconductor switch 212 may be respectively configured such that an N-channel MOSFET device capable of being turned on/off and a backward diode are connected in parallel.

Here, the foregoing semiconductor switch device is not limited to the N-channel MOSFET device, and it will be apparent to those skilled in the art that any device capable of being turned on/off by a gate voltage, for example, an IGBT, a GTO, an IGCT, or the like can be used for the device.

In this case, the diode connected in parallel to the N-channel MOSFET device may be disposed in a backward direction to prevent the MOSFET device from being damaged by a backward voltage when breaking a fault current. Furthermore, it is configured such that the first semiconductor switch 211 and the second semiconductor switch 212 are connected in series in opposite directions facing each other to break all fault currents flowing in both directions.

In addition, in a circuit of the solid insulated switch 200 according to an embodiment of the present disclosure, a snubber circuit 220 in which a capacitor Cs 221 and a resistors Rs 222 are arranged in series may be configured to be connected in parallel to the main circuit unit 210. Here, a front end of the capacitor Cs 221 may be connected to a front end of the first semiconductor switch 211, and a resistor Rs 222 connected in series with the capacitor Cs 221 may be connected to a rear end of the second semiconductor switch 212.

The snubber circuit 220 configured as described above may erase energy generated by the system A 1 inductance component 11 when an accident occurs in the system B 2, and may erase energy generated by the system B 2 inductance component 21 when an accident occurs in the system A 1.

Describing by way of an example, when a fault current is detected due to the occurrence of an accident in any line of the system B 2, the first semiconductor switch is turned off through a gate circuit of the first semiconductor switch 211. In this case, the first semiconductor switch 211 may be damaged due to energy generated by the system A 1 inductance components L1 11.

Therefore, in the solid insulated switch 200 according to an embodiment of the present disclosure, the snubber circuit 220 consisting of the capacitors Cs 221 and the resistor Rs 222 may be provided in parallel with the first and second semiconductor switches 211, 212, thereby allowing a current generated by the foregoing energy to flow through the snubber circuit 220. For this reason, the energy is consumed in an internal resistance of the capacitor Cs 221 and the resistor Rs 222, thereby preventing damage to the semiconductor switch.

Further, the solid insulated switch 200 according to an embodiment of the present disclosure may further include a freewheeling circuit 230 in which a forward diode Dfw 231 and a resistor Rfw 232 are connected in series.

Here, one end of the resistor Rfw 232 may be connected to a contact of the circuit, anode of the forward diode Dfw 231 may be connected to the other end of the resistor Rfw 232, and a cathode thereof to a common contact between the first semiconductor switch 211 and the second semiconductor switch 212.

The freewheeling circuit 230 configured as described above may erase energy generated by the system B 2 inductance component 21 when an accident occurs in the system B 2, and may erase energy generated by the system A 1 inductance component 11 when an accident occurs in the system A 1.

For example, when an accident occurs in any line of the B system 2 and a fault current is detected, the first semiconductor switch is turned off through a gate circuit of the first semiconductor switch 211, and energy stored by the system B 2 inductance component 21 is generated.

At this time, in a circuit of the solid insulated switch 200 according to the embodiment of the present disclosure, a current flowing due to a voltage generated by the energy flows to the foregoing freewheeling circuit 230, and the energy is consumed in the resistance Rfw 232 and the diode Dfw 231 of the freewheeling circuit 230, and the second diode of the second semiconductor switch 212.

Furthermore, the solid insulated switch 200 according to an embodiment of the present disclosure may further include a first air gap switch (first mechanical switch 240) connected in parallel to power source side front and rear ends in order to secure a physical insulation from the power source after the breaking of the fault current is completed.

After a breaking operation of the first and second semiconductor switches 211, 212, the first air gap switch 240 may be open through a separate signal or time delay to maintain a physical insulation of the solid insulated switch 200.

Figure 3:
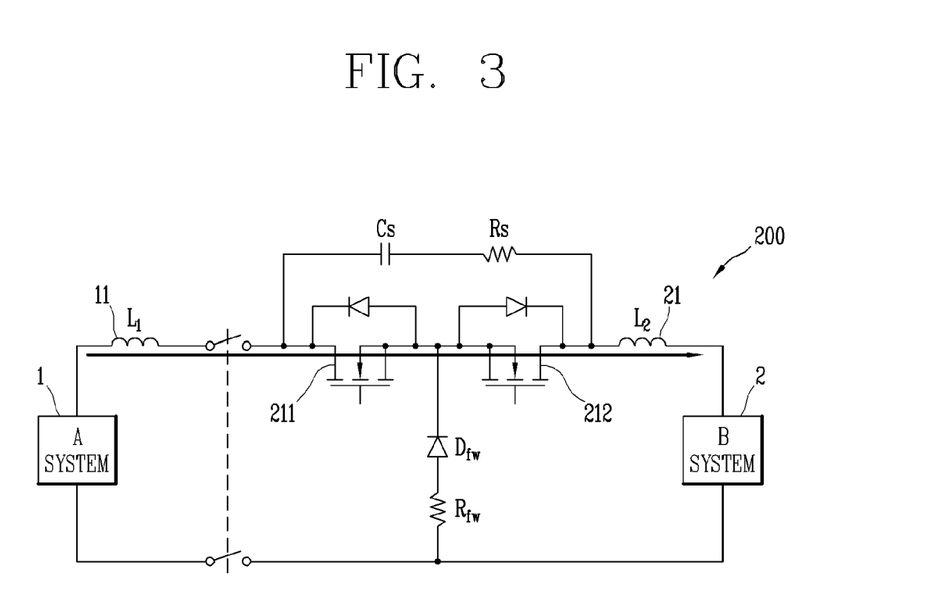
FIG. 3 is an exemplary diagram showing the flow of a current in a steady state in the circuit of the solid insulated switch 200 according to an embodiment of the present disclosure.
Figure 4A:
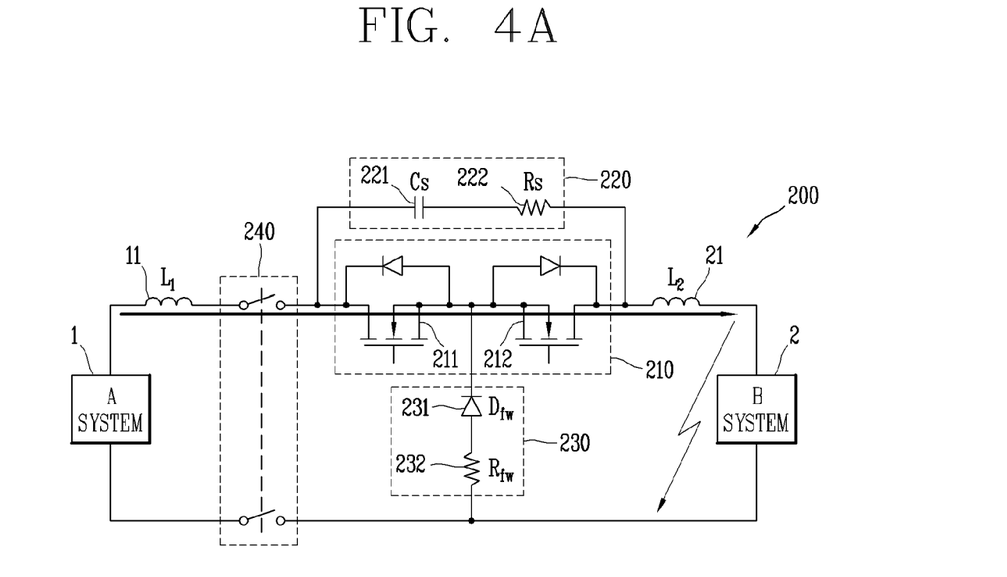
Figure 4B:
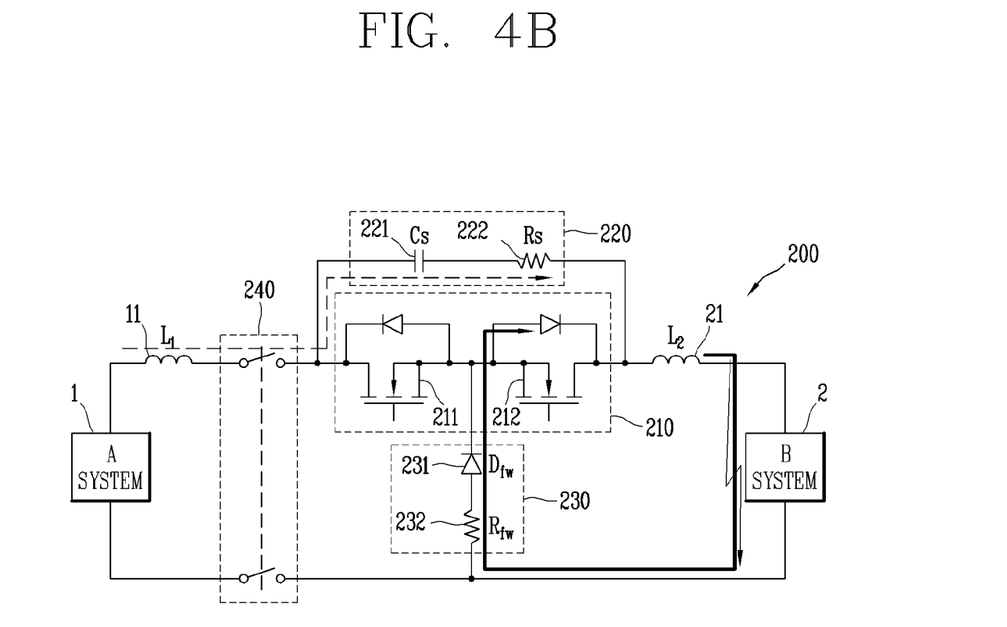
Figure 4C:
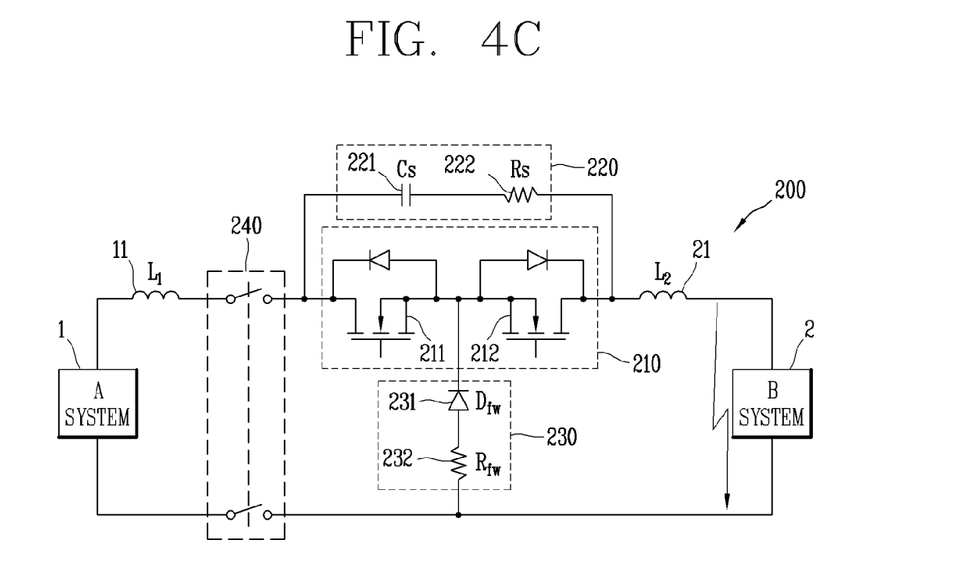
Figure 5A:
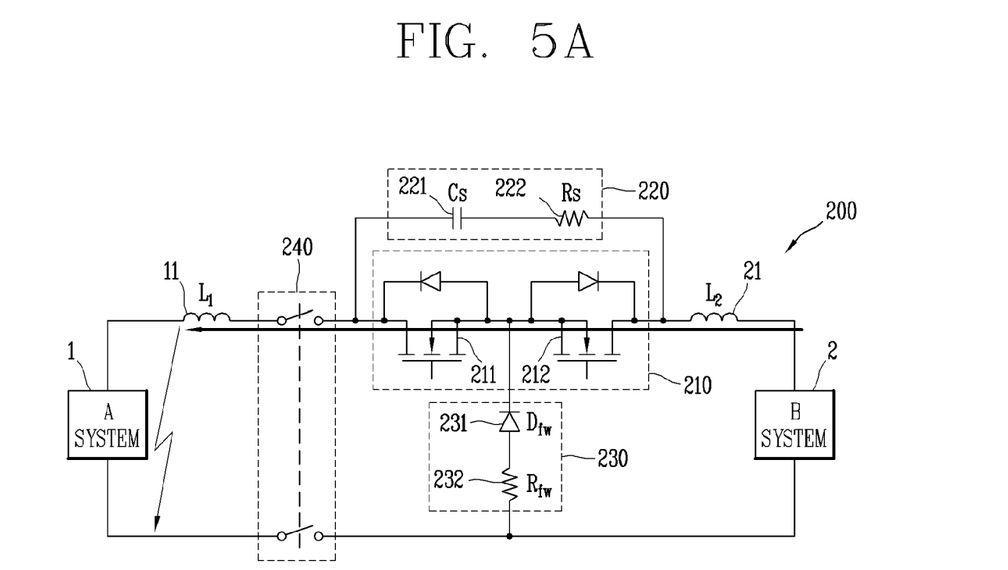
Figure 5B:
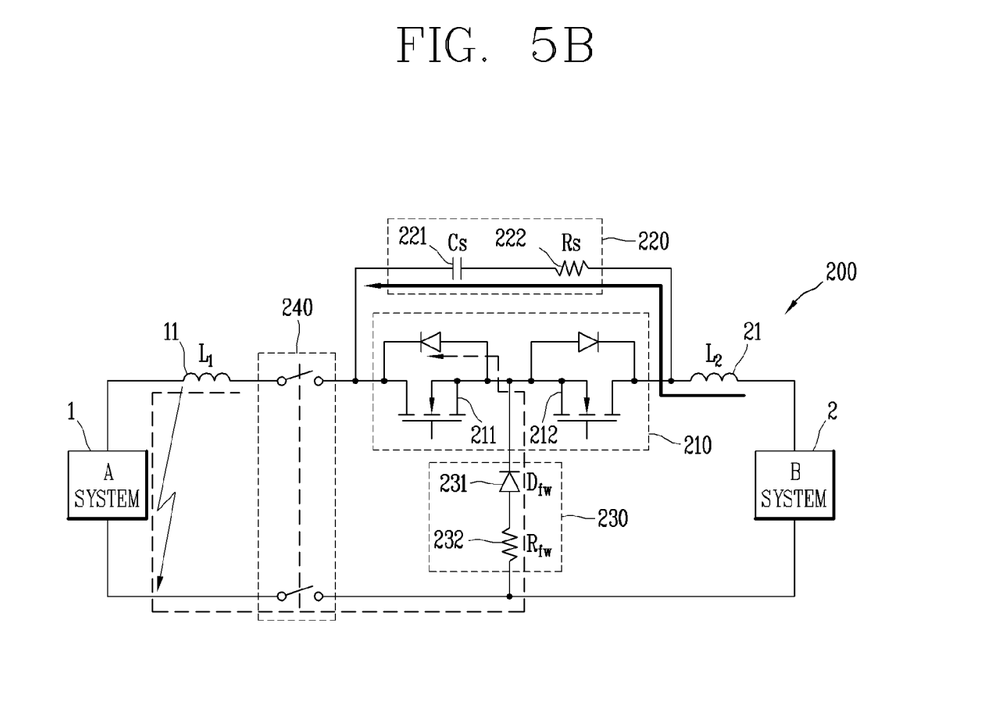
Figure 5C:
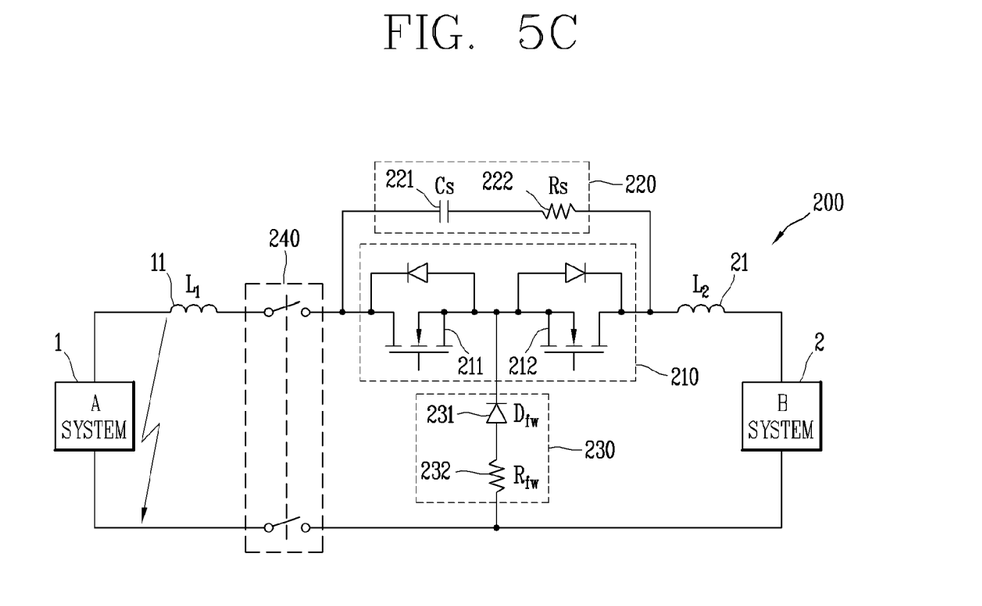

FIGS. 3 to 5 are exemplary views for explaining specific operations according to a steady state condition and the occurrence of a failure in a circuit of the solid insulated switch 200 according to an embodiment of the present disclosure.

First, FIG. 3 is an exemplary view showing the flow of a current in a steady state in a circuit of the solid insulated switch 200 according to an embodiment of the present disclosure.

In the circuit of FIG. 3, assuming that the system A 1 is on a power source side and the system B 2 is on a load side, a current flowing from a positive pole of the power source of the circuit may form a steady current flow that flows into a negative pole of the power source via the first inductor L1 11 representing a power source side inductance component, through the first and second semiconductor switches 211, 212 capable of bidirectional conduction, and via the second inductor L2 21 representing a load side inductance component.

As illustrated in FIG. 4A, when an accident occurs at any point of the system B 2, the semiconductor switch that has sensed a fault current may be turned off to immediately break the fault current.

At this time, as illustrated in FIG. 4B, when the first semiconductor switch 211 is instantaneously turned off, energy in the same direction as that of a steady current flow may be generated by the system A 1 inductor 11 to damage the semiconductor device while flowing into the first semiconductor switch 211.

However, in the circuit of the solid insulated switch 200 according to an embodiment of the present disclosure, a current due to the energy by the backward diode provided in the first semiconductor switch 211 flows through the snubber circuit 220 connected in parallel to the first semiconductor switch 211 other than the direction of the first semiconductor switch 211. That is, the current flows through the capacitor Cs 221 and the resistor Rs 222 of the snubber circuit 220, thereby the energy is completely exhausted by an internal resistance of the capacitor Cs 221 and the resistance Rs 221.

Meanwhile, a current generated due to energy stored in the system B 2 inductor 21 flows to the freewheeling circuit 230, one end of which is connected to a common contact between the first semiconductor switch 211 and the second semiconductor switch 212, and the other end of which is connected to a ground. That is, the current flows to a diode of the second semiconductor circuit 212 through the resistor Rfw 232 and the diode Dfw 231 of the freewheeling circuit 230. For this reason, the energy may be exhausted in the resistor Rfw 232, the diode Dfw 231 of the freewheeling circuit 230, and the diode of the second semiconductor circuit 212.

Finally, the first air gap switch (first mechanical switch 240) illustrated in FIG. 4C may be open to perform a complete physical insulation from the power source.

On the other hand, FIGS. 5A to 5C illustrate the flow of a current in the solid insulated switch 220 circuit when a short circuit accident occurs in the system A 1. In this case, the system A 1 may refer to a load side, and the system B 2 may refer to a power source side.

Referring to FIG. 5A, when an accident occurs at any point of the system A 1, the semiconductor switch that has sensed a fault current may be turned off to immediately break the fault current.

At this time, describing the flow of a current with reference to FIG. 5B, when the second semiconductor switch 212 is instantaneously turned off, energy stored by the system B 2 inductance component 21 may damage the semiconductor device while flowing into the second semiconductor switch 212.

However, a current due to the energy by the backward diode provided in the second semiconductor switch 212 flows through the snubber circuit 220 connected in parallel to the second semiconductor switch 211 other than the direction of the second semiconductor switch 212. That is, the current flows through the resistor Rs 222 and the capacitor Cs 221 of the snubber circuit 220, and the energy is completely exhausted by the resistor Rs 222 and an internal resistance of the capacitor Cs 221.

Meanwhile, a current generated due to energy stored in the system A 1 inductor 11 flows to the freewheeling circuit 230, one end of which is connected to a common contact between the first semiconductor switch 211 and the second semiconductor switch 212, and the other end of which is connected to a ground. That is, the current flows to a diode of the first semiconductor circuit 211 through the resistor Rfw 232 and the diode Dfw 231 of the freewheeling circuit 230.

For this reason, the energy may be exhausted in the resistor Rfw 232, the diode Dfw 231 of the freewheeling circuit 230, and the diode of the first semiconductor circuit 211.

Finally, the first air gap switch 240 illustrated in FIG. 5C is open to perform a physical insulation from the power source.

As described above, the snubber circuit 220 provided in the solid insulated switch 200 according to an embodiment of the present disclosure may erase energy due to the system A 1 inductance component in the event of a short circuit accident in the system B 2, and erase energy due to the system B 2 inductance in the event of a short circuit accident in the system A 1.

In addition, the freewheeling circuit 230 provided in the solid insulated switch 200 may erase energy due to the system B 2 inductance component in the event of a short circuit accident in the system B 2, and erase energy due to the system A 1 inductance in the event of a short circuit accident in system A 1.

That is, according to a circuit structure of the solid insulated switch 200 according to an embodiment of the present disclosure, there is an effect of simultaneously and stably erasing energy due to both system inductance components without separately providing a snubber circuit and a freewheeling circuit on both sides, respectively, in order to erase energy due to the system inductance components when a short circuit accident occurs in the system A 1 or the system B 2.

Figure 6:
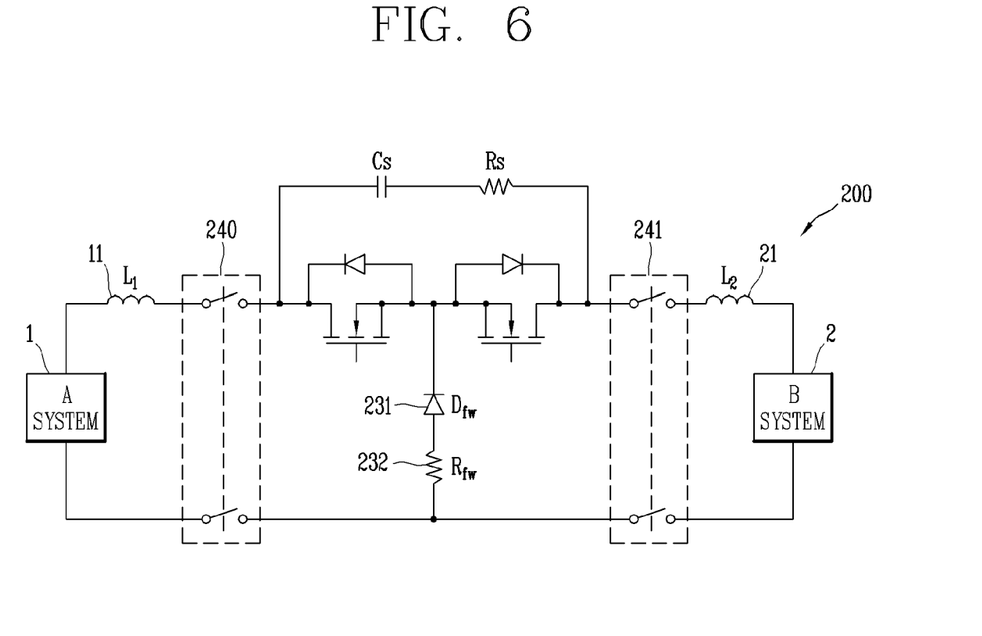
FIG. 6 is an exemplary diagram illustrating a case in which air gap switches are provided at both ends of a circuit according to an embodiment of the present disclosure.

Meanwhile, FIG. 6 illustrates a case in which air gap switches (mechanical switches) are provided at both ends of a circuit of the solid insulated switch 200 according to an embodiment of the present disclosure.

When power sources such as new renewable energy are present in both directions, first and second air gap switches (first and second mechanical switches) 240, 241 may be configured to be connected to in parallel to front and rear ends of the system A 1 and the system B 2, respectively, in order to ensure a physical insulation from both the power sources after breaking a fault current.

Therefore, after the breaking operation of the first and second semiconductor switches 211, 212, the first air gap switch 240 and the second air gap switch 241 may be simultaneously open through a separate signal or time delay to maintain a physical insulation with respect to both directions.

Figure 7:
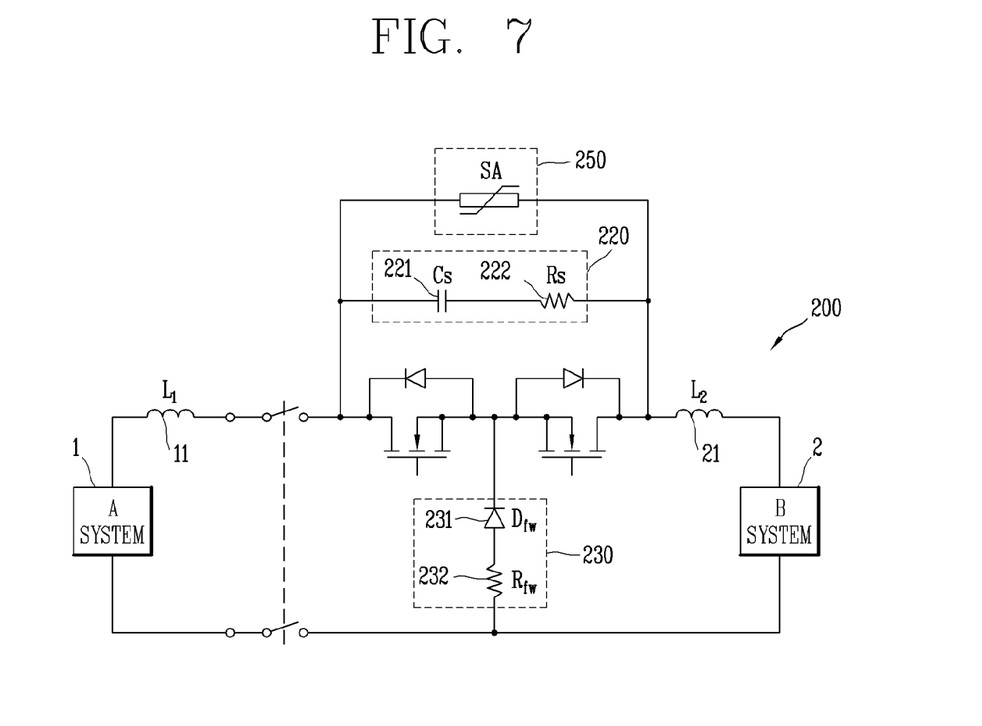
FIG. 7 is an exemplary view illustrating a case in which an arrester is additionally provided according to an embodiment of the present disclosure.

FIG. 7 is an exemplary view illustrating a case in which an arrester is additionally provided according to an embodiment of the present disclosure.

As illustrated in FIG. 7, the solid insulated switch 200 according to an embodiment of the present disclosure may further include an arrester 250, a front end of which is connected to a front end of the snubber circuit 220, and a rear end of which is connected in parallel to a rear end of the snubber circuit 220.

Thus, when a fault current occurs in the system B 2, the current of energy generated by the system A 1 inductance component may be divided to flow into the snubber circuit 220 and the arrester 250, thereby reducing the burden of the snubber circuit 220.

Furthermore, the arrester 250 may perform a function of erasing energy generated by the system B 2 inductance component as in the snubber circuit 220 when a fault current occurs in the system A 1.

On the other hand, although not shown in the drawings, the snubber circuit 220 of the solid insulated switch 200 according to an embodiment of the present disclosure may further include a second capacitor and a second resistor connected in parallel to the capacitor Cs 221 and the resistor Rs 222. Here, one end of the second capacitor may be connected to a front end of the first semiconductor switch 211, and one end of the second resistor may be connected to a rear end of the second semiconductor switch 212.

For this reason, when an accident occurs in the system B 2, a current due to energy generated by the system A 1 inductance component is divided to flow into the two capacitors and two resistors in the snubber circuit 220, respectively. Due to such a circuit structure, there is an advantage in that energy can be quickly erased in the event of a fault current by adjusting time constant.

As described above, a solid insulated switch according to the present disclosure may include a snubber circuit and a freewheeling circuit capable of breaking a bidirectional fault current using a semiconductor switch device, and simultaneously and stably erasing energy by both system inductances during breaking to protect the semiconductor switch.

In addition, the snubber circuit and the freewheeling circuit described above may be configured in the form of a module to be configured as an accessory apparatus of the solid insulated switch. That is, it will be apparent to those skilled in the art that additional mounting or combination is possible in the form of a module in the solid insulated switch circuit depending on a system inductance condition.

The embodiments described above are embodiments implementing the present disclosure, and it will be apparent to those skilled in this art that various changes and modifications may be made thereto without departing from the gist of the present disclosure. Accordingly, it should be noted that the embodiments disclosed herein are only illustrative and not limitative to the technical concept of the present disclosure, and the scope of the technical concept of the present disclosure is not limited by those embodiments. In other words, the scope protected by the present disclosure should be construed by the accompanying claims, and all the technical concept within the equivalent scope of the invention should be construed to be included in the scope of the right of the present disclosure.

The invention claimed is:

1. A solid insulated switch, configured to be connected between a first system and a second system, the solid insulated switch comprising:
a main circuit unit in which a first semiconductor switch and a second semiconductor switch are arranged in series between the first system and the second system;
a snubber circuit, a first end of which is connected to a front end of the first semiconductor switch, and a second end of which is connected in parallel to a rear end of the second semiconductor switch;
a first mechanical switch connected in parallel to power source side front and rear ends to ensure a physical insulation from the power source after breaking is complete; and
a freewheeling circuit, a first end of which is connected to a common contact between the first semiconductor switch and the second semiconductor switch, and a second end of which is connected to a ground,
wherein the capacitor is connected to a front end of the first semiconductor switch and to the power source through the front end of the first mechanical switch, and
wherein a first end of the resistor is connected in series with the capacitor, and a second end of the resistor is configured to be connected to a rear end of the second semiconductor switch and is connected to the second system located to a load side.

2. The solid insulated switch of claim 1, wherein after a breaking operation of the first and second semiconductor switches, the first mechanical switch is open through a separate signal or time delay to maintain a physical insulation of the solid insulated switch.

3. The solid insulated switch of claim 2, wherein a first MOSFET device and a first backward diode are connected in parallel for the first semiconductor switch, and a second MOSFET device and a second backward diode are connected in parallel for the second semiconductor switch,
wherein the first MOSFET device and the second MOSFET device are N-channel MOSFET devices,
wherein the first semiconductor switch and the second semiconductor switch are configured to be connected in series in opposite directions facing each other to break fault currents flowing in both directions,
wherein a cathode and an anode of the first backward diode are respectively connected to a drain and a source of the first MOSFET device, and
wherein a cathode and an anode of the second backward diode are respectively connected to a drain and a source of the second MOSFET device.

4. The solid insulated switch of claim 3, wherein in the event of an accident in the first system:
energy generated by an inductance component of the first system is erased by the freewheeling circuit and the first backward diode of the first semiconductor switch, and
energy generated by an inductance component of the second system is erased by the snubber circuit.

5. The solid insulated switch of claim 3, wherein in the event of an accident in the second system:
energy generated by an inductance component of the second system is erased by the freewheeling circuit and the second backward diode of the second semiconductor switch, and
energy generated by an inductance component of the first system is erased by the snubber circuit.

6. The solid insulated switch of claim 2, further comprising:
a second mechanical switch connected in parallel to front and rear ends of the second system to ensure a physical insulation from the first system and the second system after breaking is completed,
wherein after the breaking operation of the first and second semiconductor switches, the second mechanical switch is further open through a separate signal or time delay to maintain a physical insulation of the solid insulated switch.

7. The solid insulated switch of claim 2, further comprising:
an arrester connected in parallel to the solid insulated switch,
wherein in the event of an accident in the first system, energy generated by an inductance component of the second system is erased by the snubber circuit and the arrester, and
wherein in the event of an accident in the second system, energy generated by an inductance component of the first system is erased by the snubber circuit and the arrester.

8. The solid insulated switch of claim 1, wherein the snubber circuit is configured erase energy generated by an inductance component of the first system when an accident occurs in the second system, and erase energy generated by an inductance component of the second system when an accident occurs in the first system.

9. The solid insulated switch of claim 8, wherein the snubber circuit further comprises:
a second capacitor and a second resistor connected in parallel to the capacitor and the resistor of the snubber circuit,
wherein one end of the second capacitor is connected to a front end of the first semiconductor switch, and
wherein one end of the second resistor is connected to a rear end of the second semiconductor switch.

10. The solid insulated switch of claim 1, wherein the freewheeling circuit comprises:
a resistor configured to be connected to the ground; and
a forward diode, an anode of which is connected to the resistor, and a cathode of which is connected the common contact between the first semiconductor switch and the second semiconductor switch.

* * * * *